United States Patent
Kiley et al.

(10) Patent No.: US 7,106,589 B2
(45) Date of Patent: Sep. 12, 2006

(54) HEAT SINK, ASSEMBLY, AND METHOD OF MAKING

(75) Inventors: Richard F. Kiley, Holiday, FL (US); Simone Bush, Pinellas Park, FL (US)

(73) Assignee: AALL Power Heatsinks, Inc., Clearwater, FL (US)

(*) Notice: Subject to any disclaimer, the term of this patent is extended or adjusted under 35 U.S.C. 154(b) by 166 days.

(21) Appl. No.: 10/847,535

(22) Filed: May 17, 2004

(65) Prior Publication Data
US 2005/0135062 A1 Jun. 23, 2005

Related U.S. Application Data

(63) Continuation-in-part of application No. 10/745,293, filed on Dec. 23, 2003.

(51) Int. Cl.
*H05K 7/20* (2006.01)
*H01L 23/467* (2006.01)

(52) U.S. Cl. ............... 361/700; 361/709; 165/104.14; 165/104.33

(58) Field of Classification Search ........ 361/694–699, 361/701–705, 706–712, 717–719, 722, 727; 174/15.2, 16.3; 257/706–727; 165/80.3, 165/80.4, 104.21, 104.14, 104.33, 121, 122, 165/185; 29/890.03
See application file for complete search history.

(56) References Cited

U.S. PATENT DOCUMENTS

| | | | | |
|---|---|---|---|---|
| 4,145,708 A * | 3/1979 | Ferro et al. | ................... | 257/715 |
| 5,329,993 A * | 7/1994 | Ettehadieh | ............. | 165/104.14 |
| 5,379,830 A * | 1/1995 | Itoh | ....................... | 165/104.27 |
| 5,396,947 A * | 3/1995 | Itoh | ....................... | 165/104.14 |
| 6,237,223 B1 * | 5/2001 | McCullough | .......... | 29/890.032 |
| 6,374,905 B1 * | 4/2002 | Tantoush | ................... | 165/80.3 |
| 6,394,175 B1 * | 5/2002 | Chen et al. | ................ | 165/80.3 |
| 6,625,021 B1 * | 9/2003 | Lofland et al. | ............. | 361/697 |
| 6,666,260 B1 * | 12/2003 | Tantoush | ................... | 165/80.3 |
| 6,745,824 B1 * | 6/2004 | Lee et al. | ............. | 165/104.14 |
| 6,779,595 B1 * | 8/2004 | Chiang | .................. | 165/104.33 |
| 6,785,140 B1 * | 8/2004 | Artman et al. | .............. | 361/709 |
| 6,830,098 B1 * | 12/2004 | Todd et al. | ............ | 165/104.33 |
| 6,843,307 B1 * | 1/2005 | Yuyama et al. | ........ | 165/104.26 |
| 6,894,900 B1 * | 5/2005 | Malone | ...................... | 361/700 |
| 6,967,845 B1 * | 11/2005 | Chiang et al. | ............. | 361/709 |
| 2003/0192671 A1 * | 10/2003 | Lee et al. | ................... | 165/80.3 |

FOREIGN PATENT DOCUMENTS

| | | | |
|---|---|---|---|
| EP | 0889524 A2 * | 7/1999 |
| JP | 403096258 A * | 4/1991 |
| JP | 406069385 A * | 3/1994 |
| JP | 410153674 A * | 6/1998 |
| JP | 02003078091 A * | 3/2003 |
| JP | 02003336976 A * | 11/2003 |

* cited by examiner

*Primary Examiner*—Michael Datskovskiy
(74) *Attorney, Agent, or Firm*—Michael J. Persson; Lawson & Persson, P.C.

(57) ABSTRACT

A heat sink, method of making a heat sink, and a heat sink assembly. The heat sink includes a base and a plurality of heat pipes that extend from the base. The base is dimensioned and shaped to promote good thermal contact with the heat source, and the heat pipes are attached thereto in such a manner as to promote good thermal contact to the working fluid. Each heat pipe includes an outer surface and an inner surface that form a condenser portion from which from heat is transferred during condensation of the working fluid.

14 Claims, 14 Drawing Sheets

HEAT SINK, ASSEMBLY, AND METHOD OF MAKING

CLAIM OF PRIORITY

This application is a Continuation-in-Part of co-pending U.S. patent application Ser. No. 10/745,293, filed Dec. 23, 2003.

FIELD OF THE INVENTION

The present invention relates to the field of thermal management devices and, in particular, to heat sinks for convectively cooling electrical devices and components, to assemblies utilizing these heat sinks, and to methods of making such heat sinks and assemblies.

BACKGROUND OF THE INVENTION

Semiconductors and other electrical components generate heat as a by-product of their operation. As technology has advanced, the amount of heat to be dissipated from many of these components has risen dramatically, while the acceptable cost of heat dissipating devices has remained constant or, in many cases, has dropped. Consequently, the art of heat sinking to cool heat dissipating components has continually evolved to meet these new market requirements.

One current need involves the cooling of IGBT semiconductors, which often have power dissipation requirements of over 500 Watts. Until now, liquid cooled heat sinks have been the only effective means for cooling many of these high power devices and, consequently, these types of heat sinks have become the fastest growing segment of the power heat sink industry. Unfortunately, liquid cooling is a last resort due to its high cost and potential for catastrophic failure in the event that leaks occur. Therefore, many designers have eschewed liquid cooling and, instead have accepted reduced performance from these devices in order to allow them to be cooled by forced air convective heat sink assemblies.

Forced air convective heat sink assemblies have typically used finned metal heat sinks to dissipate heat generated by electrical components. These finned metal heat sinks generally include a substantially rectangular base plate to which the heat generating device or devices are mounted, and a plurality of fins projecting from the base plate for dissipating the generated heat. In many applications, a fan is attached to the assembly in order to force cooling air across the fins of the heat sink and enhance cooling from the heat sinks. In these applications, the amount of heat that may be dissipated from heat sink of given volume at a given air velocity is directly related to the efficiency of the heat sink.

Heat sink efficiency is defined as thermal performance generated per given volume. An efficient heat sink provides substantial cooling, while consuming a small physical volume. In general, the more surface area the heat sink has, the more heat you can typically transfer from the component. However, in many applications, other factors come into play that can limit the effectiveness of any increase in heat sink surface area. One such factor is the flow profile of the fluid at its interface with the heat dissipating surfaces. In many cases, the fluid flowing along fins of a finned heat sink will form a boundary layer having substantially laminar flow. As fluid flowing in this fashion is relatively poor at removing heat, these boundary layers tend to increase in temperature, with heat being primarily dissipated by the turbulent air flowing adjacent to this layer. Boundary layers are especially troublesome when fins are spaced closely together, as the boundary layers formed on adjacent fins tend to overlap along the bottom portion of the trough created by the adjacent fins and the base, causing what is commonly referred to as "choking". This choking limits the surface area of the boundary layer that is in contact with the flow of turbulent fluid and, consequently, limits the overall thermal performance of the heat sink.

One common means of reducing the effect of choking in finned heat sinks has been to utilize a plurality of "pin fins", which extend from the base and have spaces therebetween that act to break up any boundary layers that would be formed on long, straight fins. Pin fin heat sinks come in many forms and may or may not appear as individual pins. For example, some heat sinks utilize traditional finned extrusions that are cross cut to produce short finned sections broken up by spaces. Others are cast to have substantially cylindrical extending pins. Others are impact extruded to create a variety of unique configurations. Still others are manufactured through skiving and broaching operations, or by fully machining the desired profile. Regardless of their particular configuration, the common thread is that the spaces between the pins, sections of fin, etc. act to reduce the thickness of boundary layers about each pin and increase the amount of turbulent air flowing there between. This reduction in boundary layer thickness generally allows pins to be more densely spaced than straight fins, without choking, resulting in increased effective surface area and increased heat sink efficiency.

Unfortunately, pin fin type heat sinks also have distinct limitations. The most significant of these limitations is caused by conduction losses from the heat source though the pins. Conduction is the process of transferring heat through a specific medium without perceptible motion of the medium itself. When applied to heat sinks, this conduction occurs through molecule to molecule contact and, accordingly, can be said to follow a substantially linear path from the heat source to the tips of the fins or pins. At each of these molecules along the way, the amount of heat transferred from one molecule to the other is dependent upon the thermal conductivity of the material. Materials having high thermal conductivities tend to transfer heat more efficiently, meaning that the adjacent molecule becomes hotter than it would were the material a poor conductor. However, even the best conducting metals are not perfect conductors and, therefore, the temperature of a metal heat sink will always be higher at its base than it is at the tips of its fins. Because heat transfer is higher when the temperature difference between the air and the hot surface is greater, and the fins or pins are incrementally cooler the further they are from heat source, any increase in fin or pin height will have an incrementally reduced effect upon the thermal performance of the heat sink, and consequently, will result in a decrease in heat sink efficiency.

Therefore, there is a need for a heat sink that will efficiently cool heat-generating equipment. It is likewise recognized that, to increase heat sink efficiency, there is also a need to reduce the thickness of boundary layers between fins or pins and to reduce conduction losses through the fins or pins.

SUMMARY OF THE INVENTION

In its most basic form, the present invention is a heat sink having a base from which a plurality of heat pipes extends to form the surfaces from which heat is convected.

A heat pipe is a simple heat-exchange device that relies upon the boiling and condensation of a working fluid in order to transfer heat from one place to another. The basic principle behind all heat pipes is that a large amount of heat is required in order to change a fluid from a liquid to a gas. The amount of heat required to effect this phase change in a given fluid is referred to as the "latent heat of vaporization". Similarly, because the second law of thermodynamics states that energy may not be lost, but may only be transferred from one medium to another, the energy that is absorbed by the fluid during its change to a gas is subsequently released when the gas is condensed back into a liquid. Because the latent heat of vaporization is usually very high, and the vapor pressure drop between the portion of the heat pipe in which the fluid is boiled and the portion where is it condensed is very low, it is possible to transport high amounts of heat from one place to another with a very small temperature difference from the heat source to the location of condensation. In fact, at a given temperature difference, a heat pipe is capable of conducting up to one hundred and fifty times as much heat as a solid copper pipe of equal cross section, and as much as three hundred times as much heat as an aluminum member of equal cross section. Therefore, heat pipes have traditionally been used to efficiently transfer heat from one point to another in applications where there is limited physical space to effect such cooling proximate to the heat source.

The present invention uses heat pipes in a manner in which they have not heretofore been utilized; i.e. as the primary convective surfaces of the heat sink. As noted above, the basic embodiment of the heat sink of the present invention includes a base and a plurality of heat pipes that extend from the base. The base is dimensioned and shaped to promote good thermal contact with the heat source, and the heat pipes are attached thereto in such a manner as to promote good thermal contact to the working fluid. Each heat pipe includes an outer surface and an inner surface that form a condenser portion from which from heat is transferred during condensation of the working fluid. In some embodiments, each heat pipe is a closed system that includes its own working fluid and an evaporator portion that is in contact with the heat sink base. However, in other embodiments the heat pipes share a common reservoir of working fluid, preferably located within the base plate, and do not include individual evaporator portions.

The type, number, and layout of the heat pipes extending from the base are largely a function of the application in which the heat sink is to be used. For example, in forced convection applications, where the velocity of the air tends to reduce the thickness of the boundary layers surrounding the heat pipes, the pipes are spaced more closely together. Conversely, in natural convection applications, in which airflow is not forced over the heat pipes and boundary layers surrounding each pipe are thicker, the heat pipes are preferably spaced farther apart from one another. Regardless of their application, heat sinks in accordance with the present invention will always include a plurality of heat pipes that each convect heat from a substantial portion of their outer surface area. These heat pipes are spaced primarily to maximize conduction based upon the conductivity of the base, allowing pins to be spaced such that they are placed were they are needed; ex. directly above high heat sources. In addition, heat pipes need not be the only convective surfaces and may be augmented through the use of additional metal fins, pins, or other art recognized convective surfaces.

In some embodiments of the invention, the heat pipes are merely pressure vessels having a working fluid disposed therein that simply exploits gravitational forces to return condensed fluid flow to the evaporator portion thereof. In these embodiments, the heat sink assembly is dimensioned for mounting such that, in operation, the heat source is at a lower elevation than the condenser portions of the heat pipes. In other embodiments, however, the heat pipes utilize wicks or other fluid transport means for transporting the condensed fluid to their evaporator portions. In these embodiments, the relationship between the assembly and the heat source is irrelevant, allowing the heat sink to be mounted in a variety of orientations.

The outer surfaces of each heat pipe are preferably sized and shaped to maximize heat transfer therefrom. In some embodiments, these outer surfaces have dimples, bumps, grooves, or other means for reducing the thickness of the boundary layer formed thereon. In other embodiments, appendages, such as fins, are affixed to the outer surfaces of the heat pipes in order to increase the surface area thereof. The preferred appendages are merely a plurality of flat cylindrical fins that extend from the outer surface of each heat pipe. However, other embodiments include appendages that extend between, and are affixed to, at least two heat pipes. Regardless of their number and orientation, it is recognized that each appendage attached to an outer surface of the heat pipe is done so in such a way as to promote good thermal contact and, thereafter, is considered to be a part of the heat pipe itself.

The basic embodiment of the heat sink assembly of the present invention includes the basic embodiment of the heat sink discussed above and a means for forcing air over the heat pipes. The means for forcing air over the heat pipes is preferably a fan or blower that is mounted directly to the heat sink in a desired orientation. In some embodiments, the fan is mounted to the heat sink by attaching a pair of side plates to the outside edges of the base plate and attaching a fan to these side plates. It is preferred that the fan be mounted to the side plates such that air flows in a direction parallel to the plane formed by the base plate. In these embodiments of the assembly, is preferred that appendages, such as fines, be disposed from the outer surfaces of the heat pipes. However, in some embodiments of the assembly the fan if mounted such that air flows perpendicular to, and impinges upon, the base plate. In these embodiments, outer surfaces having bumps, dimples, grooves or the like are preferred over those having fins or other appendages.

In some embodiments of the assembly, the heat source is an integral part thereof. Accordingly, the present invention contemplates heat sink assemblies in which components are mounted to the base plate, or the base plate forms part of the heat generating device or component itself. For example, the base plate could form an integral part of the housing of a power supply, be laminated to a printed circuit board, or otherwise integrated with the heat source itself.

The present invention also includes a method for making the heat sinks described above. The first step in this method is to obtain a base plate having good thermal conductivity. A plurality of heat pipe receiving details is formed within the base plate. These details may be depressions into, holes through, or other details within the base plate that are dimensioned to allow a heat pipe to be received thereby. Heat pipes of sufficient quantity and size to be received by all receiving details are obtained and are disposed within these details. The heat pipes are then secured with the receiving details such that the heat pipe is in good thermal contact with the base plate. In some embodiments, this securing step involves press fitting the heat pipe into the receiving detail with a suitable thermal interface material, such as thermal grease, disposed therebetween. In others, the heat pipes are fixtured after they are disposed within the receiving details and secured by epoxy bonding, soldering, or other art recognized means.

Some embodiments of the method further include the step of disposing at least one appendage about the outer surface of at least one heat pipe. Others include forming a reservoir within the base plate and in communication with at least two heat pipes and disposing a working fluid therein. In these embodiments, it is preferred that the base plate include two portions that are affixed together and sealed after the reservoir is formed therebetween.

Therefore, it is an aspect of the present invention to provide a heat sink that uses air convection to cool electrical devices and components, such as SCR's, Transistors, Diodes, IGCT's and IGBT's, having power dissipation requirements of over 100 Watts.

It is a further aspect of the present invention to provide a highly efficient heat sink that minimizes conduction losses, and hence temperature differences, between the heat sink base and its conductive surfaces.

It is a further aspect of the present invention to provide a heat sink and method of making that allow the heat sink to be manufactured from standard, "off the shelf", heat pipes and base plate stock.

It is a still further aspect of the present invention to provide a heat sink that is capable of distributing high heat loads.

It is a still further aspect of the present invention to provide a heat sink that allowing a matching of heat sources and heat sinks with differing thermal characteristics.

It is a still further aspect of the present invention to provide a heat sink capable of reducing overall system size and costs from those currently available.

It is a still further aspect of the present invention to provide a heat sink assembly that does not require active liquid cooling to dissipate large amounts of power from a heat generating component or device.

It is a still further aspect of the present invention to provide a heat sink assembly that may be used in forced air and forced liquid convection cooling systems.

These aspects of the invention are not meant to be exclusive and other features, aspects, and advantages of the present invention will be readily apparent to those of ordinary skill in the art when read in conjunction with the following description, and accompanying drawings.

DETAILED DESCRIPTION OF THE INVENTION

Figure 1:
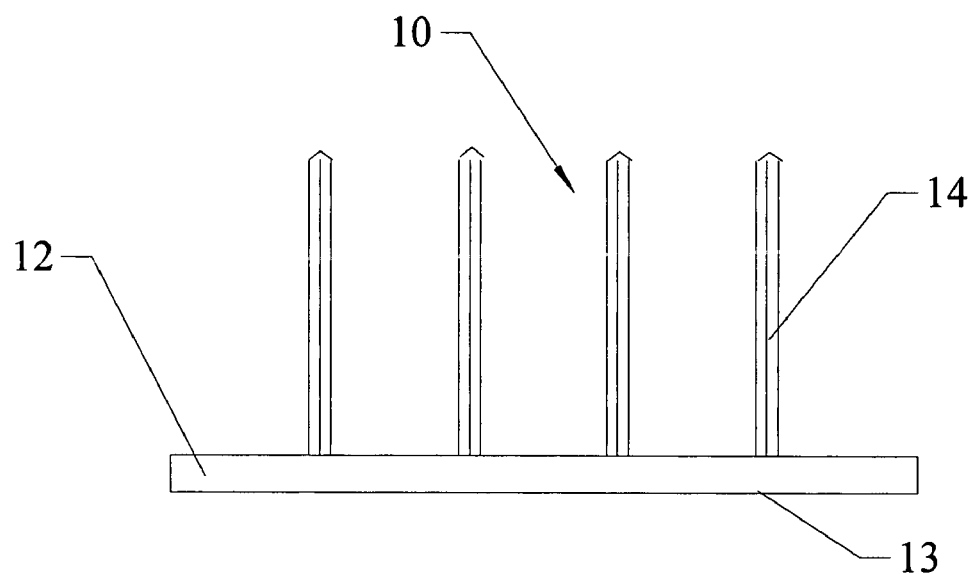
FIG. 1 is a side view of one embodiment of the heat sink of the present invention.
Figure 2:
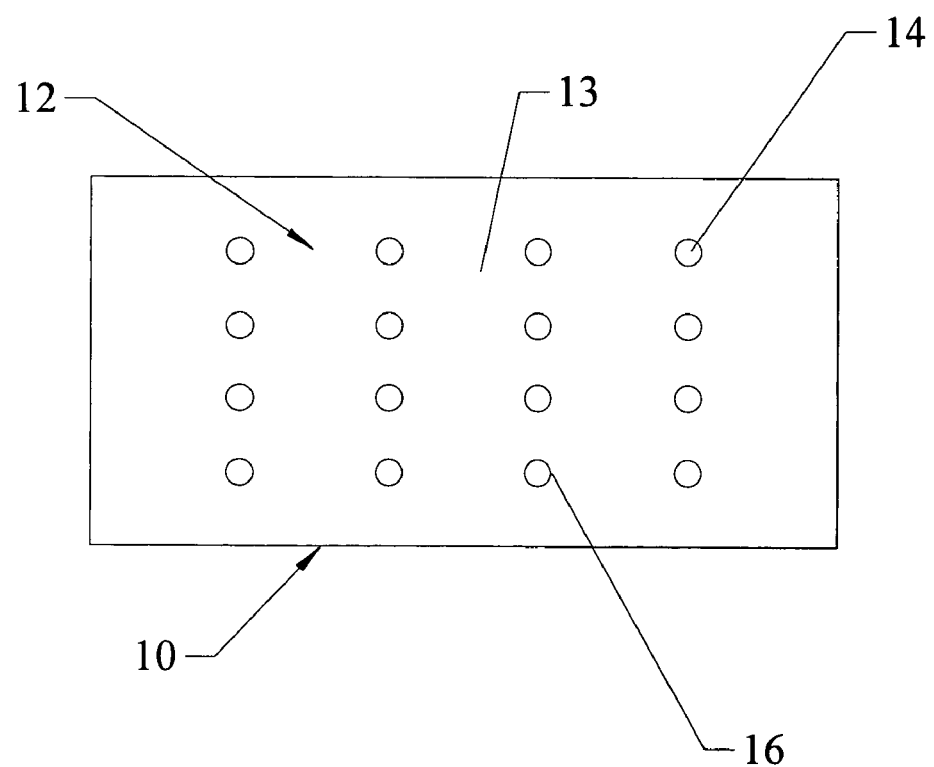
FIG. 2 is a top view of the heat sink of FIG. 1.

Referring first to FIGS. 1 and 2, one embodiment of the heat sink 10 of the present invention is shown. The heat sink 10 includes a base plate 12 and a plurality of heat pipes 14 that extend from the top surface 15 of the base plate 12. The base plate 12 has a bottom surface 13 that is dimensioned and shaped to promote good thermal contact with the heat source (not shown). The base plate 12 is manufactured of a material, such as copper or aluminum, that has relatively good thermal conductivity, and should be of sufficient thickness to efficiently spread the heat from a heat source (not shown) disposed upon its bottom surface 13 to the heat pipes 14 extending from its top surface 15. In many of the embodiments shown herein, the base plate 12 is portrayed as a substantially solid rectangular plate. However, it is recognized that base plates 12 having different shapes and/or cross sections may be utilized and the present invention should not be viewed as being limited to heat sinks 10 having rectangular base plates 12.

Figure 3:
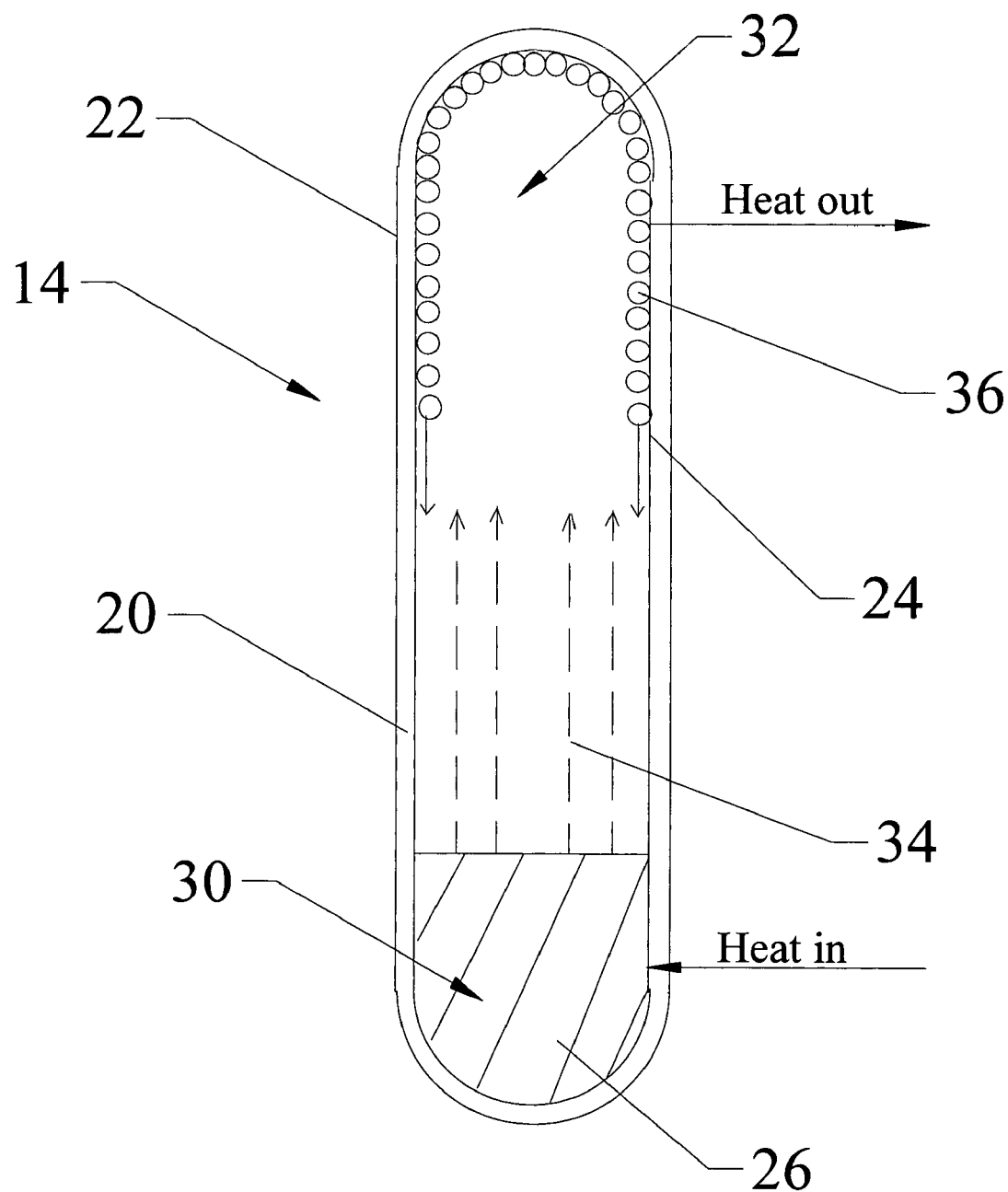
FIG. 3 is as cut away side view of one embodiment of a heat pipe used in connection with the heat sink of the present invention demonstrating its operation.

The heat pipes 14 may take many forms, and virtually any type of heat pipes 14 currently available could be joined to the top surface 15 of the base plate 12 to form the heat sink 10 of the present invention. As shown in FIG. 3, one type of heat pipe 14 that could be used includes a closed pressure vessel 20 having an outer surface 22 and an inner surface 24, and in which a working fluid, in the form of a liquid 26, is disposed. The liquid 26 is disposed in the evaporator portion 30 of the vessel, where it is heated and changes phase into a gaseous working fluid 34. The gaseous working fluid 34 then fills the remaining interior of the vessel 20, which forms the condenser portion 32 thereof. Because the outer surface 22 of the vessel 20 surrounding the condenser portion 32 is cooler then the interior of the vessel 20, heat flows from the inner surface 24 to the outer surface 22, where is it convectively removed from the system. This transfer of this heat is accomplished through condensation of the gaseous working fluid 34, which releases the latent heat of vaporization from the fluid 34 and forms droplets of condensate 36 along the inner surface 24 of the vessel 20. The condensate 36 is then transported by gravitational forces back into the evaporator portion 30 of the vessel 20 and mixes with the liquid 26, where the cycle is repeated.

As demonstrated by the above description, the vessel 20 isolates the working fluid 26, 34, 36 from the outside environment. By necessity, the vessel 20 must be leak-proof, maintain the pressure differential across its walls, and enable transfer of heat to take place from and into the working fluid. Selection of a fabrication material for the vessel 20 depends on many factors including chemical compatibility, strength-to-weight ratio, thermal conductivity; ease of fabrication, porosity, etc. Once filled with the working fluid 26, the vessel 20 is preferably evacuated to eliminate any pockets of air that might otherwise prevent the flow of the gaseous working fluid 34 to substantially the entire inner surface 24 of the condenser portion 32 of the vessel 20.

Working fluids 26 are many and varied. The prime consideration is the selection of the working fluid 26 is operating vapor temperature range. Often, several possible working fluids 26 may exist within the approximate temperature band. Various characteristics must be examined in order to determine the most acceptable of these fluids for the application considered such as good thermal stability, compatibility with wick and wall materials, vapor pressure relative to the operating temperature range, high latent heat, high thermal conductivity, liquid phase viscosities and surface tension, and acceptable freezing or pour point, to name a few. The selection of the working fluid 26 must also be based on thermodynamic considerations, which are concerned with the various limitations to heat flow occurring within the heat pipe like, viscous, sonic, capillary, entrainment and nucleate boiling levels. Many conventional heat pipes use water and methanol as working fluid, although other more exotic materials, such as fluorocarbons, are also used.

The heat pipe 14 described in connection with FIG. 3 is a basic design that requires the heat sink 10 to be orientated such that gravity will return the condensate 36 to the evaporator portion 30. However, other embodiments of the invention utilize heat pipes 14 having internal wicks (not shown), or other fluid transport means for transporting the condensate 36 to their evaporator portions 30. A typical wick is a porous structure, made of materials like steel, aluminum, nickel or copper in various pore size ranges. Wicks are typically fabricated using metal foams, and more particularly felts, with the latter being more frequently used. By varying the pressure on the felt during assembly, various pore sizes can be produced. By incorporating removable metal mandrels, an arterial structure can also be molded in the felt. The prime purpose of the wick is to generate capillary pressure to transport the condensate 36 from the condenser portion 32 of the vessel to the evaporator portion 30 proximate to the heat source (not shown). It must also be able to distribute the liquid 26 around the evaporator portion 30 to any area where heat is likely to be received by the heat pipe 14. Often these two functions require wicks of different forms. The selection of the wick for a heat pipe depends on many factors, several of which are closely linked to the properties of the working fluid. However, such selection is an art unto itself and, therefore, is not discussed herein.

Referring again to FIGS. 1 and 2, regardless of their type, the heat pipes 14 are preferably arranged such that the boundary layers formed thereon will not overlap at the airflows and working temperatures anticipated for a given application. As shown in FIGS. 1 and 2, the heat pipes 14 are arranged in a rectangular four by four pattern forming rows and columns of spaces between heat pipes 14. This arrangement is a good one for use in natural convection environments, and is also preferred in applications using impingement air flow, as the rows and columns reduce the pressure drop created by airflow, promoting good airflow away from the heat sink. However, in other embodiments, such as those in which the airflow is parallel to the base plate, the heat pipes 14 may be arranged in a staggered arrangement in order to induce additional turbulence to the airflow and decrease the thickness of the boundary layers upon the outer surface of each heat pipe 14.

As described herein, the heat pipes 14 may be attached to the base plate 12 in many ways. For example, in the embodiment of FIG. 1, the heat pipes 14 are simply press fit into holes 17 bored through the base plate 14 such that the evaporator portion thereof is in sufficient thermal contact with the base plate to promote boiling of the working fluid disposed therein.

Figure 4:
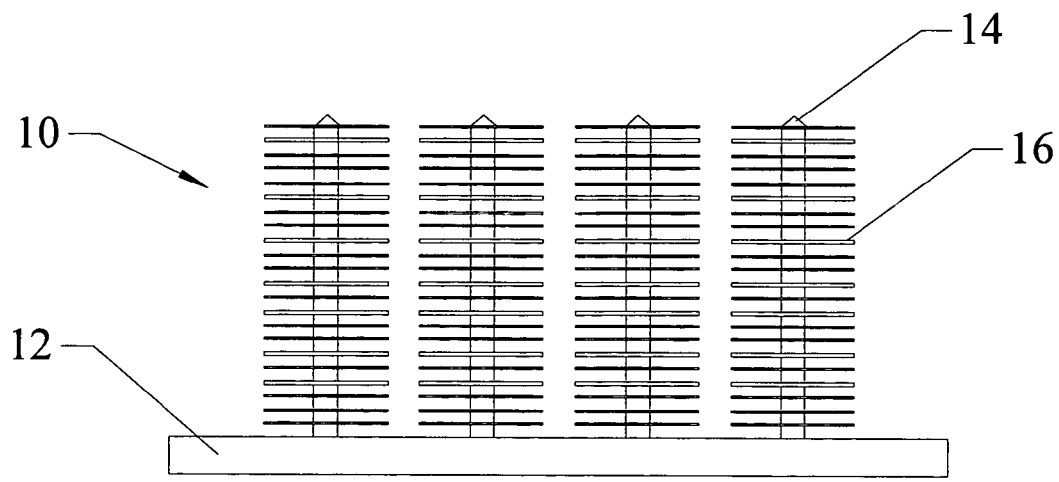
FIG. 4 is a side view of an embodiment of the heat sink of the present invention that includes heat pipes from which a plurality of fins extends.
Figure 5:
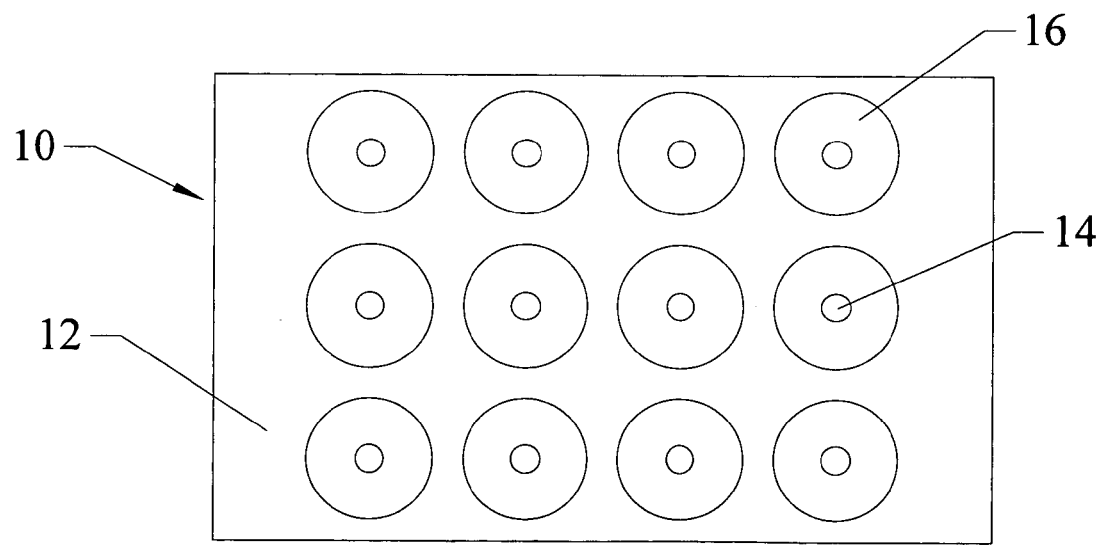
FIG. 5 is a top view of the heat sink of FIG. 4.

FIGS. 4 and 5 show an alternative embodiment of the heat sink 10 for use in applications in which airflow is disposed parallel to the top surface 15 of the base plate 12. This embodiment includes a similar base plate 12, having top and bottom surfaces 15, 13, and a similar arrangement of heat pipes 14, as the embodiment of FIGS. 1 and 2. However, in this embodiment, each of the heat pipes 14 includes a plurality of fins 16 that extend from the outer surface 22 of the condenser portion 32 thereof. These fins 16 are preferably manufactured of a conductive material, such as copper or aluminum, and are affixed to the outer surface 22 of the heat pipe 13 in such a manner as to promote good heat flow therefrom such that the fins 16 can be said to form an integral part of each heat pipe 14. This may be accomplished through a number of art recognized processes, including brazing, soldering, epoxy bonding, press fitting, mechanical or other means. The fins 16 are spaced apart from one another a distance that is determined by the nature of the airflow between these spaces.

Figure 6:
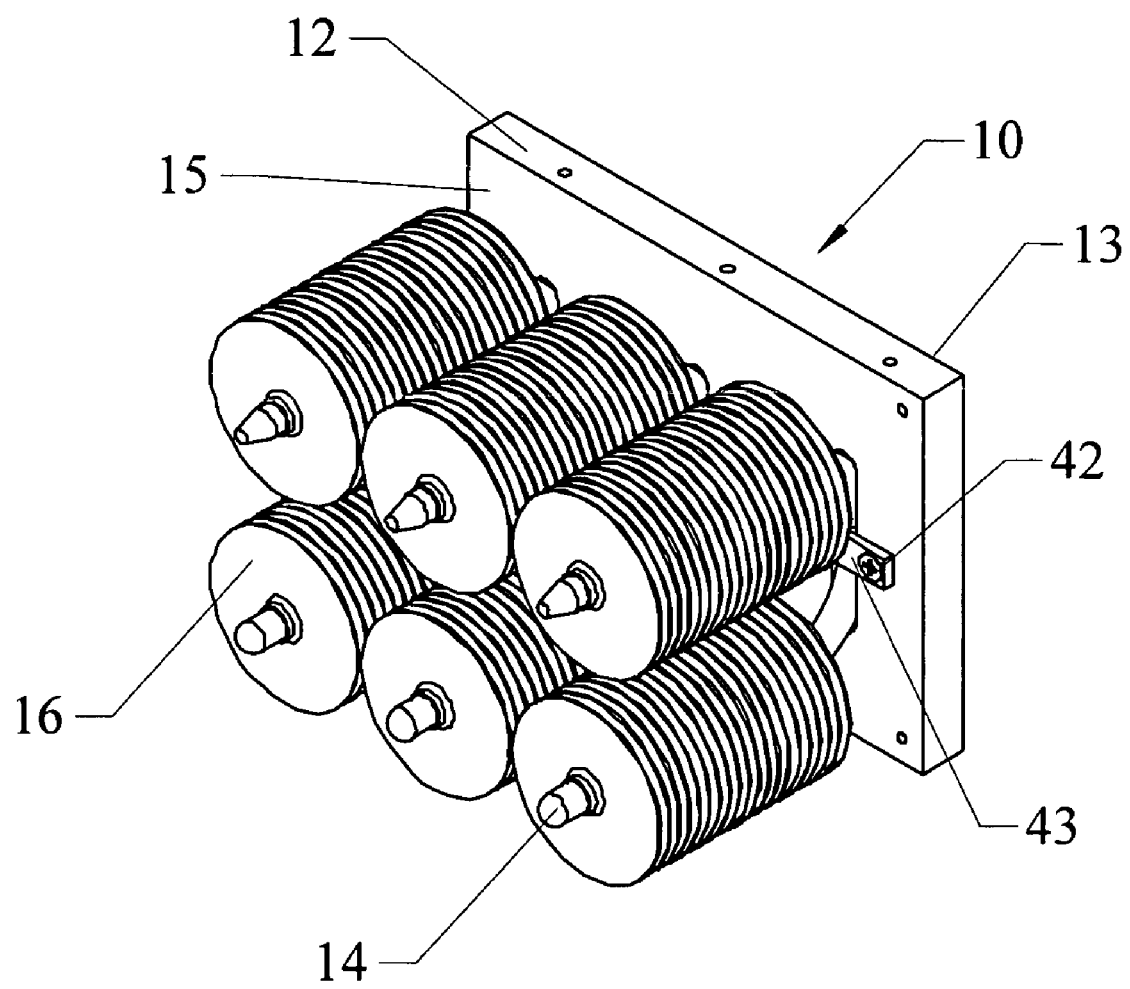
FIG. 6 is a top isometric view of an alternative embodiment of the heat sink of the present invention in which U-shaped heat pipes are disposed and secured with the base plate.
Figure 7:
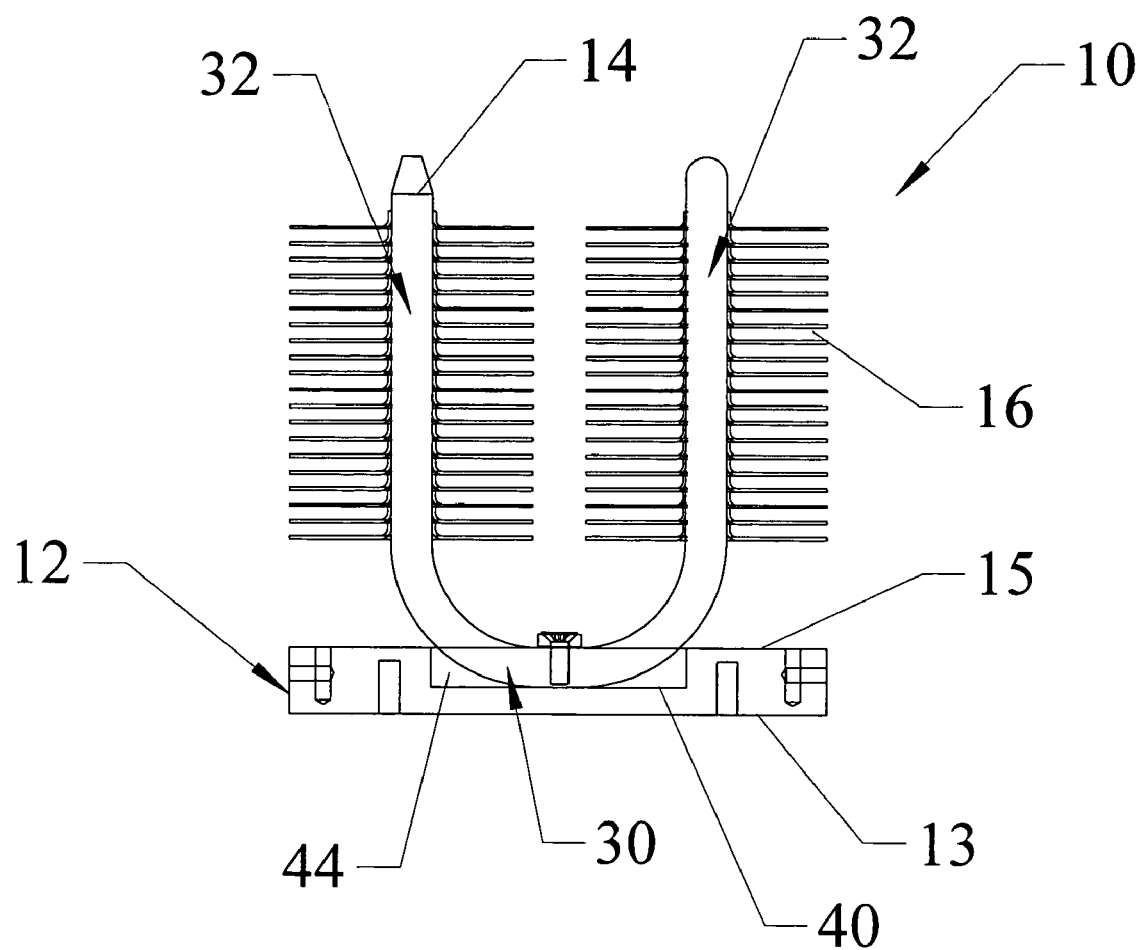
FIG. 7 is a cut away end view of the heat sink of FIG. 6.

FIGS. 6 and 7 show a similar embodiment of the heat sink to that shown and described with reference to FIGS. 4 and 5. However, in this embodiment, the heat pipes 14 are substantially U-shaped such that two condenser portions 32 are in communication with a single evaporator portion 30 at the bottom of the U-portion of the heat pipe 14. The evaporator portions 30 of each heat pipe 14 may be affixed to the base plate 12 in a number of ways. As shown in FIGS. 6 and 7, this is accomplished by forming mating grooves 44 in the top surface 15 of the base plate 12, disposing the U-portion of the each heat pipe 14, and securing the heat pipes into the grooves 44 via mechanical fasteners, such as a bar 42 and screws 43. However, in other such embodiments, the U-portions of the heat pipes 14 are affixed by soldering, brazing, press fitting, epoxy bonding, or other art-recognized means for securing a U-shaped object into a flat plate.

Figure 8:
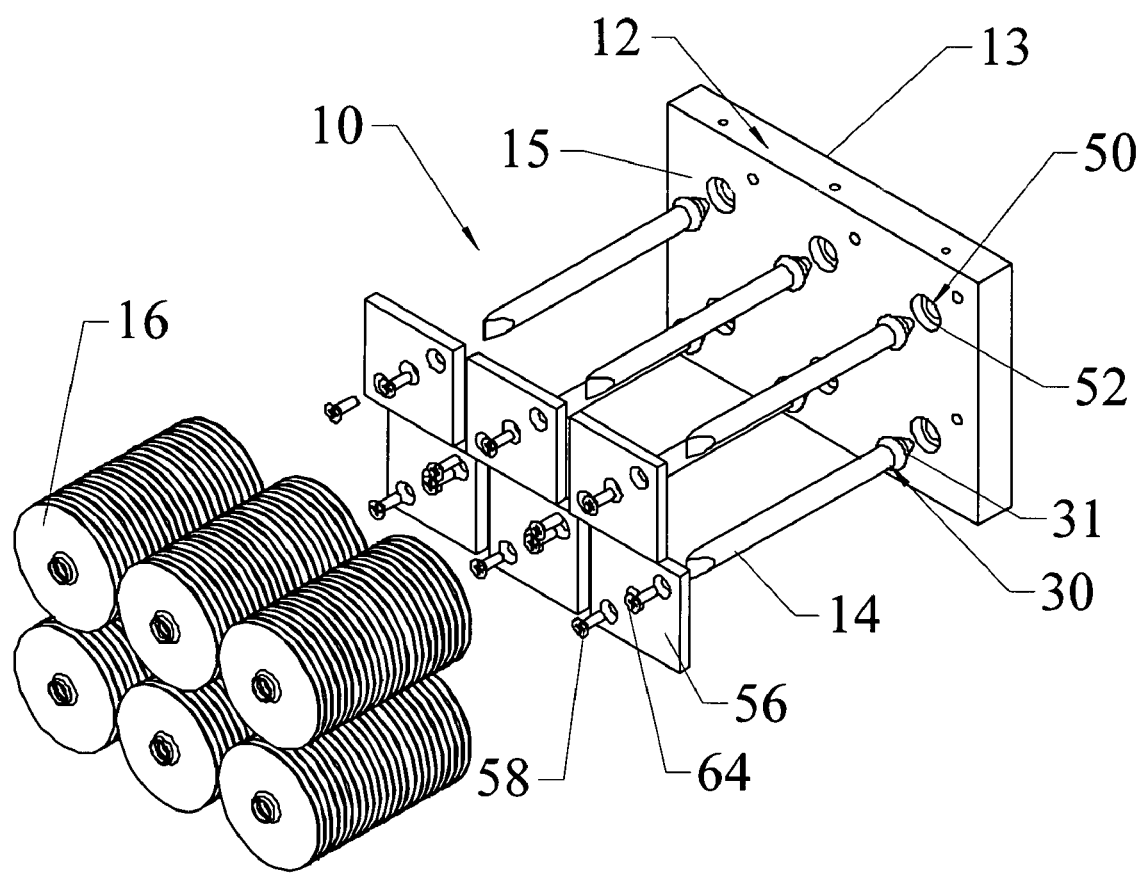
FIG. 8 is a top isometric assembly view of an alternative embodiment of the heat sink of the present invention in which the pipes have profiled ends that are disposed and secured within recesses in the base plate using compressive mounting plates.

Referring now to FIG. 8, another embodiment of the heat sink 10 is shown. This heat sink is similar to that of FIGS. 4 and 5, as it includes a similar base plate 12, having top and bottom surfaces 15, 13, and a similar arrangement of heat pipes 14 from which a plurality of fins 16 extend. However, the base plate 12 of this embodiment includes a plurality of bores 50 having shaped inner surfaces 52 machined in its top surface 15, and the heat pipes 14 each include base evaporator portions 30 that are formed with outer surfaces 31 shaped to mate with the inner surfaces 52 of the bores 50. The interface between the outer surfaces 31 of the evaporator portions 30 and the interior surfaces 52 of the bores 50 may be enhanced through the use of known thermal interface materials, thermally conductive epoxy or the like. However, in some applications, such as where the base plate and heat pipes are manufactured of copper or other soft materials, no interface material is used and, instead, the deformation of the two surfaces 31, 52 together forms a highly conductive interface. Regardless of how the interface is made, the heat pipes 14 of this embodiment are held into place, at least during assembly, by hold down plates 56 having bores 64 therethrough of a larger diameter than the body of the heat pipe 14 and smaller diameter than the evaporator portions 30 thereof. The plates 56 are compressed against the evaporator portions 30 by screws 58, which are secured into mating threaded bores 60 in the top surface 15 of the base plate 12, and act to exert downward pressure causing the interface surfaces 31, 52 to be drawn together.

Figure 9:
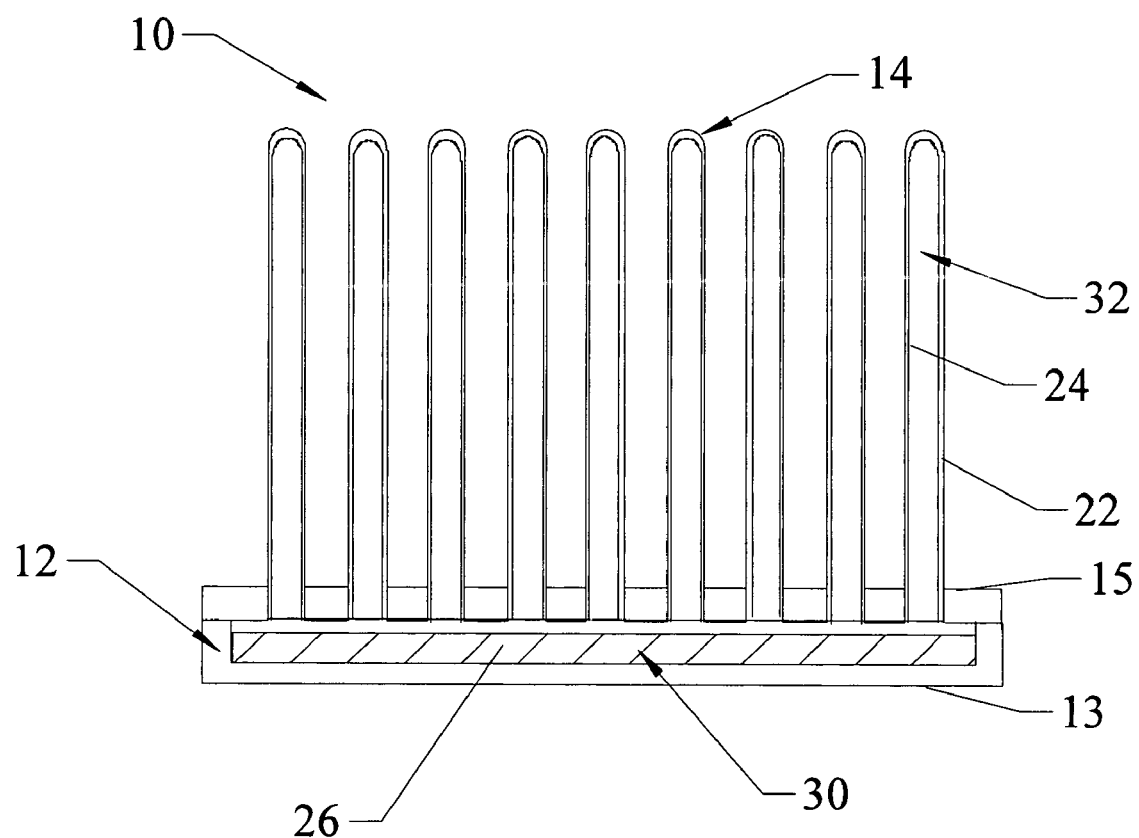
FIG. 9 is a cut away side view of an alternative embodiment of the heat sink of the present invention in which all heat pipes are in fluid communication with a central reservoir of working fluid disposed within the base plate.

Referring now to FIG. 9, still another embodiment of the heat sink 10 is shown. In this embodiment, each heat pipe 14 is linked to a common evaporator portion 30 within the base plate 12, which contains the liquid working fluid 12. In this embodiment, the base plate 12 is preferably manufactured of two pieces that are joined together such that the will withstand the pressure generated by the evaporation of the working fluid 26. The evaporator portion 30 is preferably proximate to the bottom surface 13 of the base plate and is preferably filled with liquid 26 to a level such that provides an open space between the level of the liquid and the openings leading to the condenser portion 32 of each heat pipe 14. The condenser portions 32 of each heat pipe are embedded into the top surface 15 of the base plate 12 and are sealed thereto such that they will likewise withstanding the working pressure of the system. In operation, the heat pipes 14 will function in the same manner as described above. However, by eliminating the interface between the base plate 12 and liquid 26 within the heat pipe 14, the overall efficiency of the heat sink 10 is enhanced.

Figure 10B:
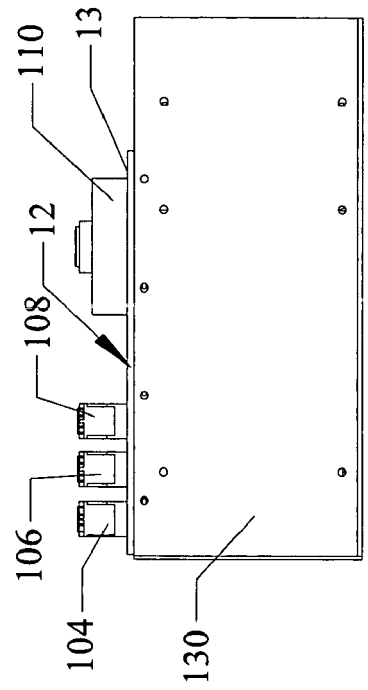
FIG. 10B is a side view of the heat sink assembly of FIG. 10A.
Figure 10C:
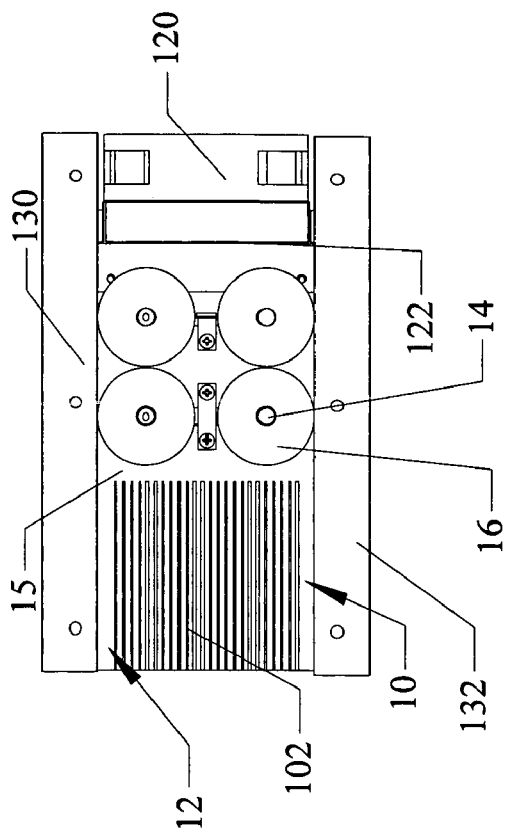
FIG. 10C is a top view of the heat sink assembly of FIGS. 10A and 10B.
Figure 10A:
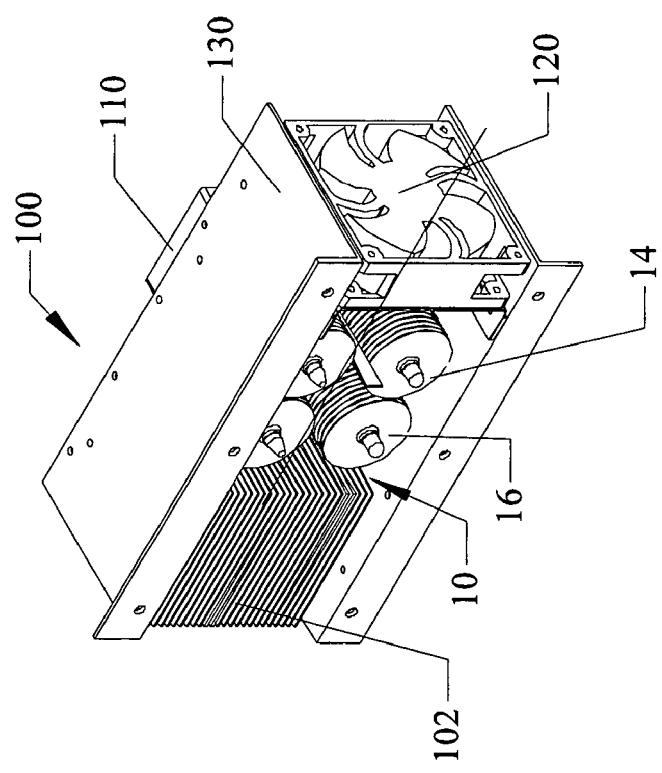
FIG. 10A is a top isometric view of one embodiment of the heat sink assembly of the present invention showing the fan mounted such that air if moved in substantially parallel relation to the base plate.

Referring now to FIGS. 10A–10C, one embodiment of a heat sink assembly 100 of the present invention is shown. The heat sink assembly 100 is similar in all essential respects as those described above and includes a heat sink 10 having the same base plate 12 from which heat pipes 14 extend. Further, the heat pipes 14 each have the extending fins 16 that were described with reference to FIGS. 4 and 5. However, the heat sink 10 in this case also includes a plurality of fins 102 that likewise extend from the top surface 15 of the base plate 12.

The fins 102 provide additional cooling capacity at lower cost than could be achieved using all heat pipes 14. Here, the fins 102 are disposed directly below three heat-generating components 104, 106, 108, which are mounted to the bottom surface 13 of the base plate 12. A fourth heat-generating component 110 is also mounted to the bottom surface 13 of the base plate 12 proximate to the location of the heat pipes 14. For purposes of this embodiment, the fins 102 and heat pipes 14 are disposed in their respective locations upon the base plate 12 because the fourth component 110 has a high power dissipation requirement, while the three others 104, 106, 108 do not. In such an embodiment, this arrangement is preferred as the heat pipes 14 are most useful when in close proximity to the high heat source, here the fourth component 110, while the location of both directly proximate to the air outlet 122 from the fan 120 insures a maximum temperature difference between the air flowing from the fan 120 and the surfaces of the heat pipes 14 and fins 16. However, other arrangements are possible, including those with multiple groups of heat pipes 14 and fins 102, provided the heat pipes 14 are disposed in closer proximity to the highest heat sources than the fins.

The heat sink assembly 100 of this embodiment includes a pair of side panels 130, 132 attached to the sides of the base plate 12. The side panels 130, 132 are dimensioned to extend beyond the end of the base plate 12 and attach to the fan 120. The base plates 130, 132 are dimensioned for mounting to a chassis or other surface such that the side panels 130, 132, base plate 12 and the surface form a duct through which air is blown by the fan 120. However, in other embodiments, the fan 120 is mounted such that it blows air downward in an impingement arrangement. In these embodiments, the fins 16 are eliminated from the heat pipes 14 and may or may not be replaced by other surface enhancements that are effective in impingement cooling applications.

Figure 11:
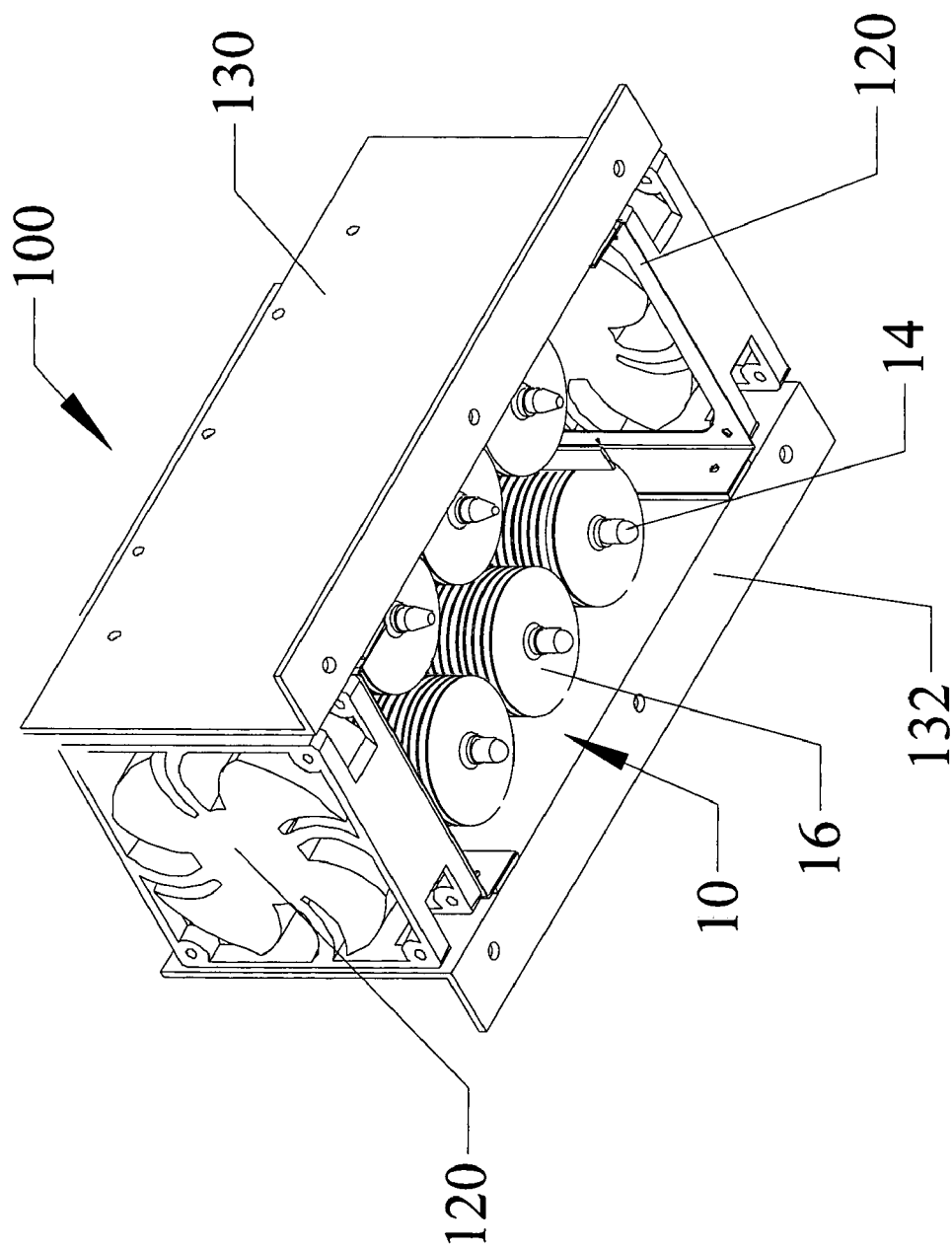
FIG. 11 is a bottom isometric view of another embodiment of the heat sink assembly of the present invention utilizing two fans.

Referring now to FIG. 11, still another embodiment of the heat sink assembly 100 is shown. This embodiment utilizes the same side panels 130, 132 and fan 120 as the assembly of FIGS. 10A–10C, but has no fins and utilizes a second fan 120 at the other end of the assembly 100. This fan 122 preferably moves air in the same direction as the other fan 120, creating a push/pull effect upon the air passed over the heat pipes 14. As was the case with the heat pipes of FIGS. 10A–10C, the heat pipes 14 of this embodiment likewise utilize radial fins 16 disposed parallel to the direction of flow.

Testing of the heat sink assembly 100 of the present invention has revealed that the area of thermal contact between the base plate 12 and the evaporator portion 30 of the heat pipe 14 is an important factor in reducing the overall thermal resistance of the system. In instances where lower power densities are to be dissipated, the amount of contact area shown in the figures above is generally sufficient to provide the benefits described above. However, in applications where higher power densities are to be dissipated, the amount of contact area is preferably increased.

Traditional means for increasing the contact area between a base plate 12 and the evaporator portion 30 of a heat pipe 14 include mounting the evaporator deep within a substantially thick base plate 12, and/or utilizing heat pipes 14 of substantially large diameter or cross section. In such cases, it has traditionally been important to braze or solder the heat pipes in place, to further reduce interface resistances. Unfortunately, each of these options has significant drawbacks. For example, thicker base plates 12 are significantly more costly than thinner ones and increase the weight of the heat sink 10 dramatically. Heat pipes 14 having larger diameters or cross sections are also far more costly than heat pipes of smaller cross section. Finally, although soldering of copper heat pipes 14 to a copper base plate 12 does not significantly add to the manufacturing costs of the system, brazing aluminum heat pipes 14 to an aluminium base plate 12 requires that such brazing be done before the heat pipes 14 are filled with the working fluid, eliminating the ability to utilize inexpensive, off the shelf, heat pipes, and increasing the overall cost of the assembly 100. Accordingly, the inventors have developed a number of means for increasing the contact area between the base plate 12 and the evaporator portion 30 of the heat pipes 14.

Figure 12A:
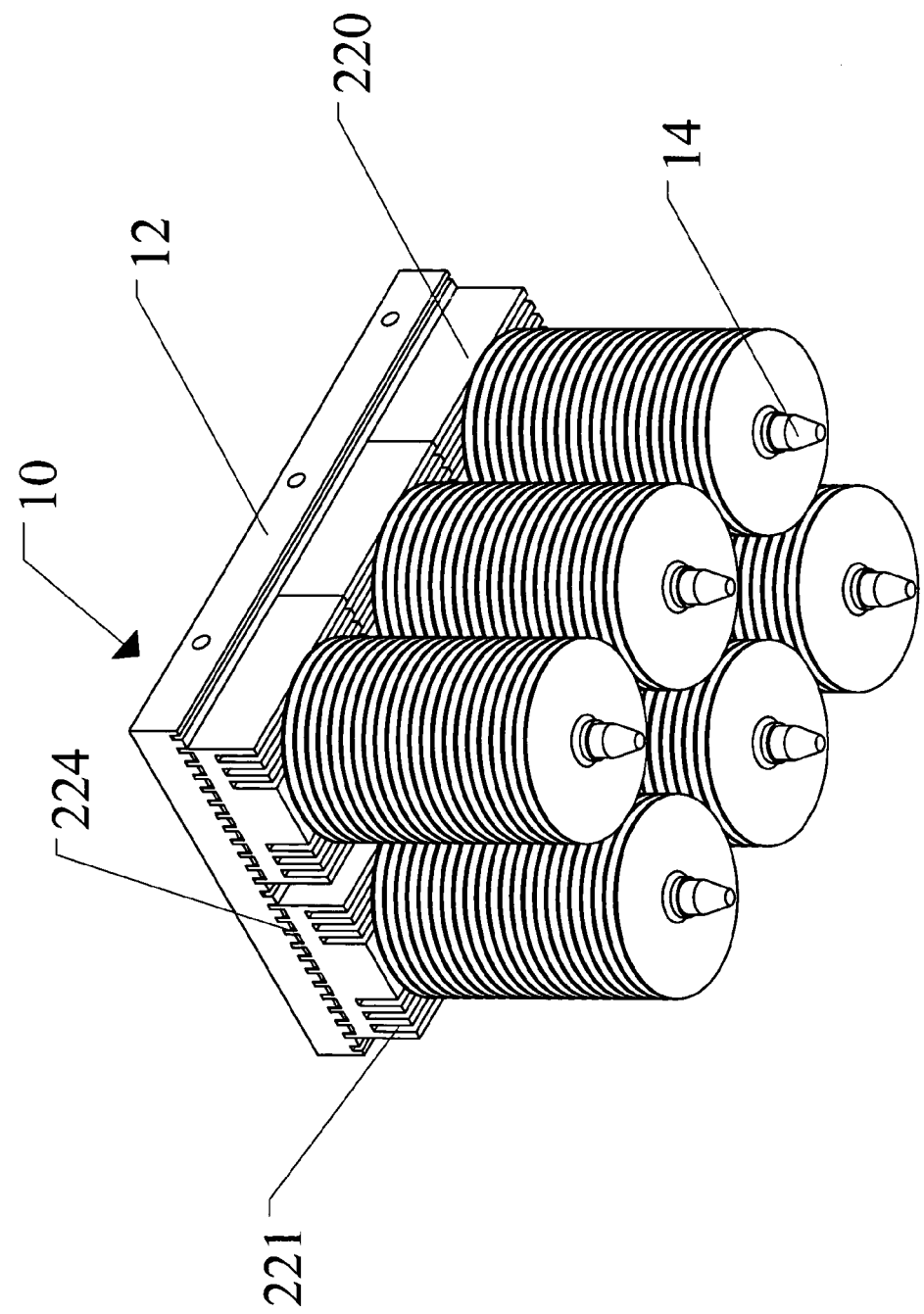
FIG. 12A is an isometric view of an embodiment of the heat sink of the present invention in which the heat pipes are attached to the base plate via conductor blocks.
Figure 12B:
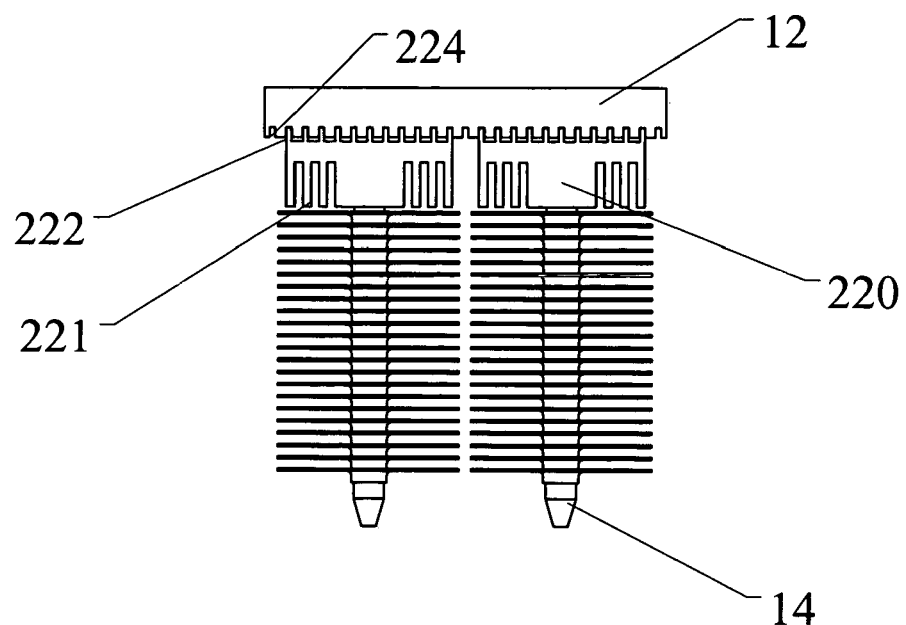
FIG. 12B is an end view of the heat sink of FIG. 12A.
Figure 12C:
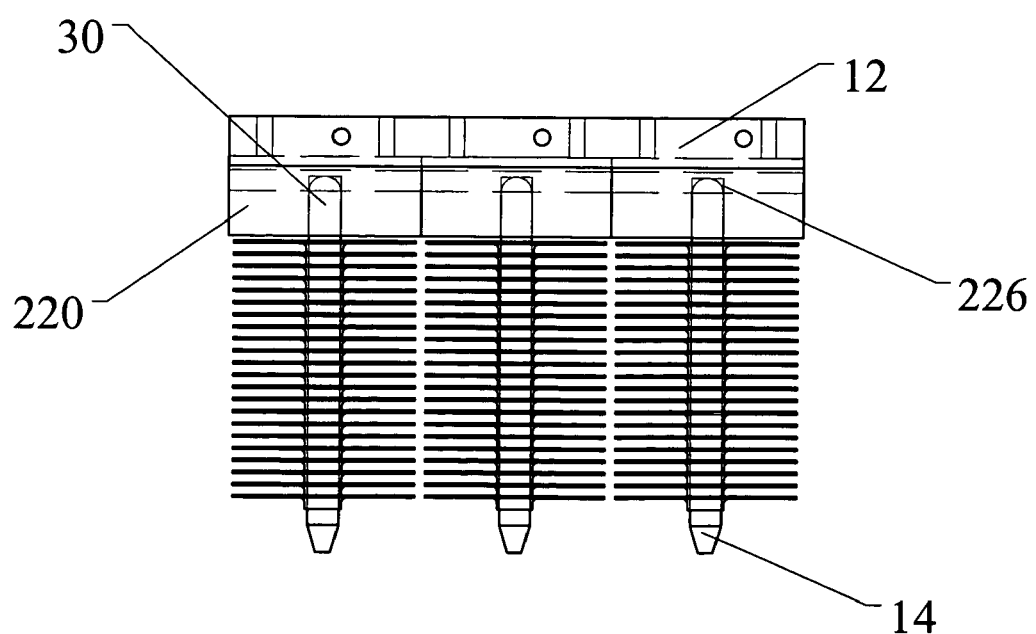
FIG. 12C is a side view of the heat sink of FIG. 12A with the conductor block cut away to show the evaporator portion of the heat pipe.

An embodiment of the heat sink 10 having the preferred means for increasing contact area between the evaporator portion 30 of the heat pipe 14 and the base plate 13 is shown in FIGS. 12A–12C. In this embodiment each of the heat pipes 14 is mounted within a separate conductor block 220 that is mounted to the base plate 13 and, once so mounted, forms a part thereof. The preferred aluminum conductor block 220 includes a series of spaced grooves 222 that mate with grooves disposed in the top surface 15 of the base plate 12. In this embodiment, both the base plate 12 and conductor block 220 are preferably extruded to include the grooves 222, 224 and are epoxy bonded together during assembly using a thin layer of thermally conductive epoxy. The use of grooves 222, 224 in such an embodiment is preferred in order to maximize the surface through which heat is conducted and, consequently, to decrease the interface resistance between the base 12 and the conductor block 220. Further, by using inexpensive extrusions, both the grooves and additional fins 221 may be formed without incurring significant manufacturing costs. However, in cases where both the base 12 and conductor block 220 are manufactured of copper and soldered together, the interface resistance is not a significant issue and the grooves 222, 224 are preferably omitted.

As shown in FIG. 12C, the evaporator portions 30 of the heat pipes 14 are each inserted within a blind hole 226 in each conductor block 220 to a point proximate to the surface thereof. As the conductor block 220 is preferably thicker than the base 12, and the blind hole 226 can be deeper into the conductor block 220 than into the base 12, such embedding provides the additional contact between the evaporator portion 30 and the heated conductor block 220, allowing more heat to be transferred thereto. Where additional contact area is desired, through-holes (not shown) may be formed through the conductor block 220 and mating blind holes (not shown) may be formed in the base plate 12 to allow heat to be directly transferred to the heat pipe 14 through both the base 12 and conductor block 220. In cases where the heat pipes 14 and conductor blocks 220 are manufactured of aluminum, the heat pipes 14 are preferably epoxy bonded into the respective blind holes 226, while copper heat pipes 14 and conductor blocks 220 are preferably soldered together.

Figure 13:
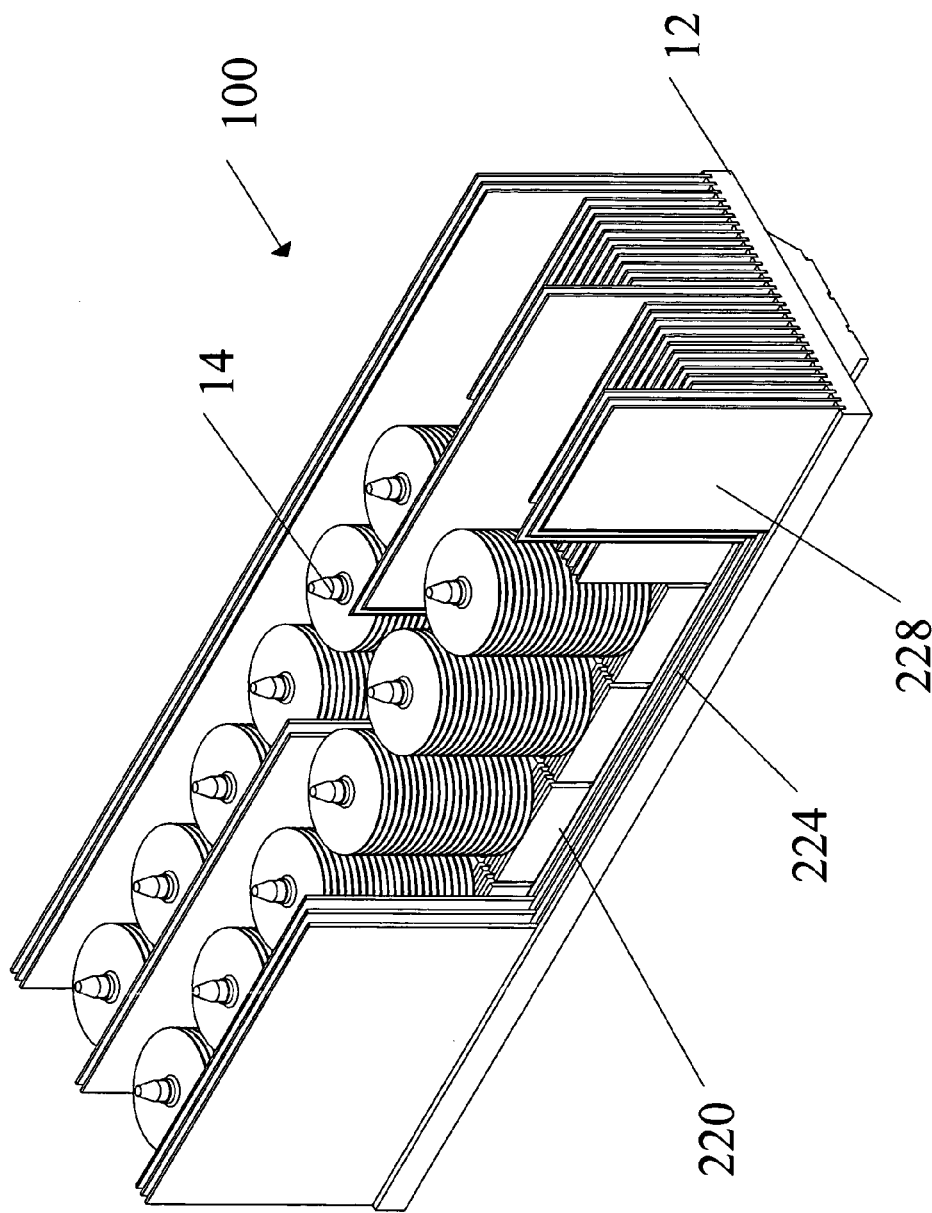
FIG. 13 is an isometric view of an embodiment of the heat sink assembly of the present invention in which the heat pipes are attached to the base plate via conductor blocks and fins are disposed within unused slots in the base plate.

An alternative embodiment of a heat sink 10 using the same type of grooved conductor blocks 220 and base plate 12 of FIGS. 12A–12C is shown in FIG. 13. In this embodiment, a larger base plate 12 is used and fins 228 are soldered or epoxy bonded into the portions of the grooves 224 in areas unoccupied by conductor blocks 220. The resulting heat sink 10 is similar to that of FIGS. 10A–10C, and offers the same advantages.

Figure 14:
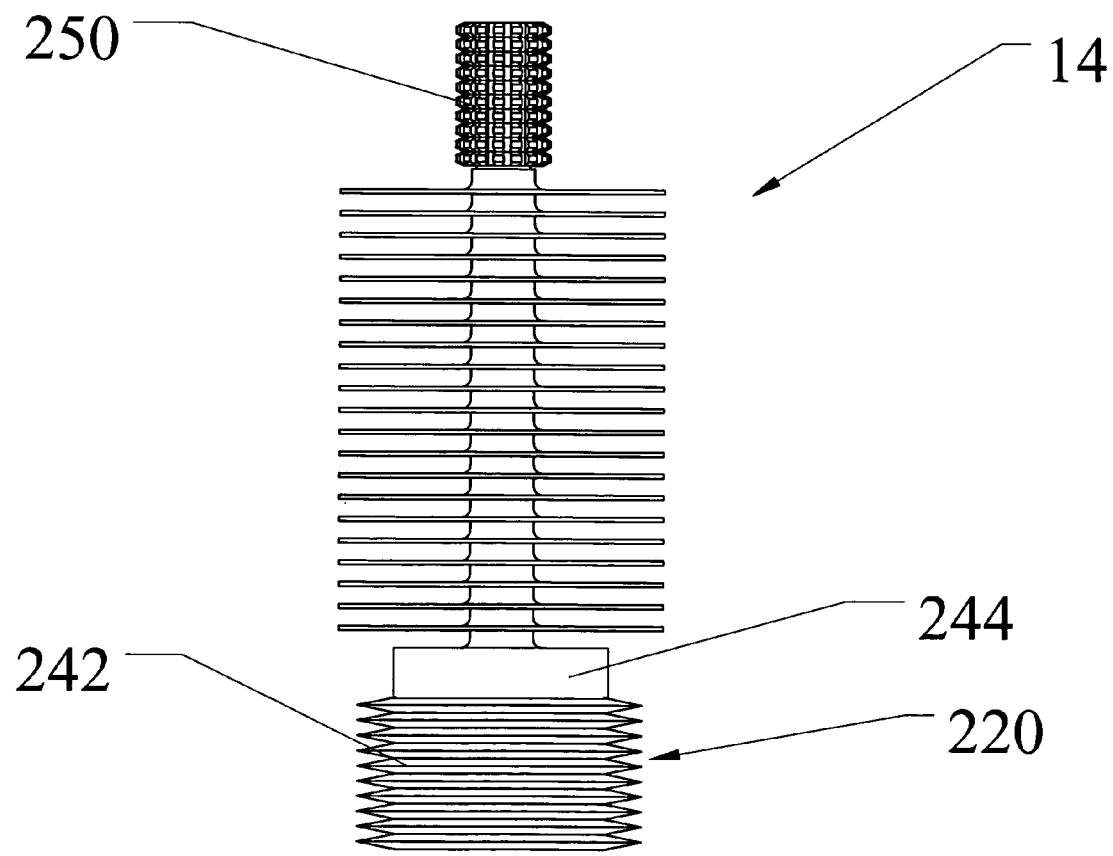
FIG. 14 is a side view of a heat pipe for use in the heat sink of the present invention in which the heat pipe is embedded within a threaded conductor block.

As shown in FIG. 14, the conductor block 220 need not be a rectangular block, but may instead be cylindrical with a plurality of threads 240 disposed therein for mating with a female threaded opening (not shown) in a base. In such embodiments, it is preferred that a stand-off portion 244 be included to extend the area for conduction to the evaporator portion and that thermal grease be applied to the threads to provide a low interface resistance and also allow individual heat pipes to be removed and replaced. However, as the main purpose is increased conduction area, some such embodiment may simply have threads extending above the surface of the base and/or be fixedly attached thereto. In either case, it is preferred that details, such holes to accept a spanner wrench or squared edges to accept a box or adjustable wrench, be included to allow the conductor block 220 to be threaded into the base plate 12 without exerting torque on the heat pipe 14. The heat pipe 14 of FIG. 14 also shows the use of a knurled top cap 250 for the heat pipe 14. The use of such a knurled top cap 250 provides additional area for convection, but is not preferred due to its additional cost.

Figure 15A:
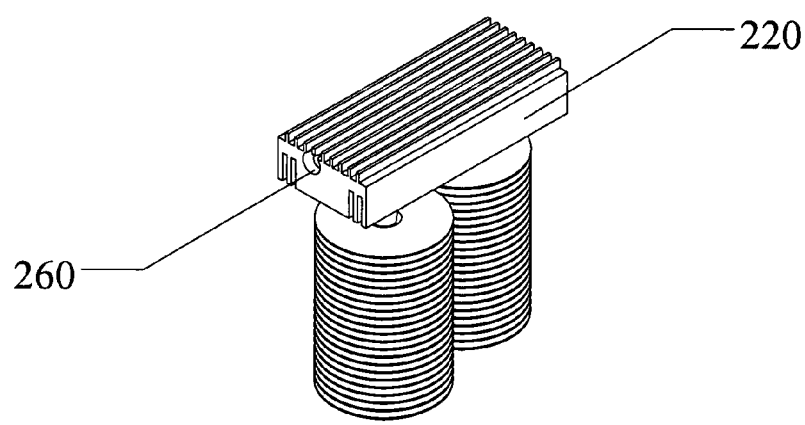
FIG. 15A is an isometric view of a pair of heat pipes and a conductor block in which the evaporator portions of the heat pipes are bent to mate with angled openings in the base plate.
Figure 15B:
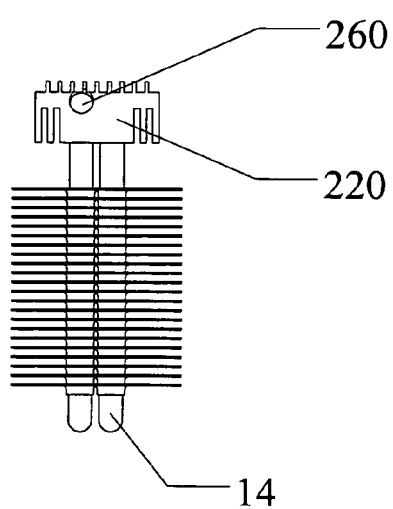
FIG. 15B is an end view of the heat pipes and conductor block of FIG. 15A.
Figure 15C:
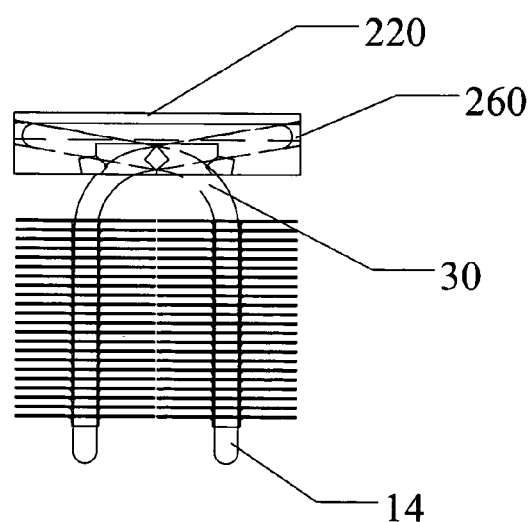
FIG. 15C is a side view of the heat pipes and conductor block of FIGS. 15A and 15B with the conductor block cut away to show the angled evaporator portions of the heat pipes.

In addition to the conductor blocks 220 of the heat sinks 10 of FIGS. 12A–14, the contact area between a base plate 12 and the evaporator portion 30 of a heat pipe 14 may be increased in a number of other manners. For example, FIGS. 15A–15C show a pair of heat pipes 14 that have evaporator portions 30 angled to mate with angled openings 260 in the conductor block 220. By entering the block 220 at an angle, a greater amount of the evaporator portion 30 is exposed to the hot conductor block 220 that a non-angled mount without the addition of the a separate conductor block. It is noted that, although a conductor block 220 is shown in these figures, that the angled evaporator portion 30 may likewise be embedded within an angled opening in a base plate. Further, it is recognized that other means for increasing the contact area between the evaporator portion 30 of the heat pipes and the base 12 of the heat sink 10 without increasing the thickness of the entire base 12 would be readily apparent to those of skill in the art. Accordingly, the invention should not be seen as being so limited.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

What is claimed is:

1. A heat sink for dissipating heat from a heat source, said heat sink comprising:
   a heat-conductive base plate;
   a plurality of heat pipes attached to and extending from said heat-conductive base plate;
      wherein each of said plurality of heat pipes comprises an inner surface, and outer surface and a working fluid disposed in contact with said inner surface;
      wherein said plurality of heat pipes are attached to said heat-conductive base plate in such a manner as to promote good thermal contact to a working fluid disposed within said plurality of heat pipes;
      wherein each of said plurality of heat pipes is a closed system comprising said working fluid and an evaporator portion in contact with said heat-conductive base; and
      wherein said plurality of heat pipes are of a number, and are spaced apart, such that each of said plurality of heat pipes convects heat from a substantial portion of the outer surface thereof; and
   means for increasing a contact area between said evaporator portion of at least one of said plurality of heat pipes and said base plate without increasing a thickness of said entire base plate.

2. The heat sink as claimed in claim 1 wherein at least one of said plurality of heat pipes is substantially U-shaped, wherein a bottom portion of said U-shaped heat pipe is attached to said heat-conductive base and forms said evaporator portion, and wherein two top portions of said U-shaped heat pipe form two condenser portions.

3. The heat sink as claimed in claim 1 wherein said means for increasing the contact area between said evaporator portion of at least one of said plurality of heat pipes and said base plate further comprises at least one conductor block attached to, and forming a part of, said base plate; and wherein at least one of said plurality of heat pipes is attached to and extends from said conductor block.

4. The heat sink as claimed in claim 3 wherein said base plate comprises a plurality of grooves in one grooved surface thereof and wherein said conductor block is adapted to attach said grooved surface.

5. The heat sink as claimed in claim 3 wherein said conductor block is a cylindrical in shape in comprises a plurality of threads, and wherein said base plate comprises at least one threaded opening therein dimensioned to mate with said plurality of threads of said conductor block.

6. The heat sink as claimed in claim 1 wherein at least one of said plurality of heat pipes comprises a plurality of flat fins that extend from said outer surface of each of said plurality of heat pipes.

7. A heat sink assembly comprising:

a heat sink comprising:

a heat-conductive base plate;

a plurality of heat pipes attached to and extending from said heat-conductive base plate;

wherein each of said plurality of heat pipes comprises an inner surface, an outer surface and a working fluid disposed in contact with said inner surface;

wherein said plurality of heat pipes are attached to said heat-conductive base plate in such a manner as to promote good thermal contact to a working fluid disposed within said plurality of heat pipes;

wherein each of said plurality of heat pipes is a closed system comprising said working fluid and an evaporator portion in contact with said heat-conductive base; and wherein said plurality of heat pipes are of a number, and are spaced apart, such that each of said plurality of heat pipes convects heat from a substantial portion of its outer surface;

means for increasing a contact area between said evaporator portion of at least one of said plurality of heat pipes and said base plate without increasing a thickness of said entire base plate; and means for forcing air over said heat pipes.

8. The heat sink assembly as claimed in claim 7 wherein at least one of said plurality of heat pipes of said heat sink is substantially U-shaped, wherein a bottom portion of said U-shaped heat pipe is attached to said heat-conductive base and forms said evaporator portion, and wherein two top portions of said U-shaped heat pipe form two condenser portions.

9. The heat sink assembly as claimed in claim 7 further comprising a plurality of convective surfaces extending from said heat-conductive base, wherein said convective surfaces comprise at least one of metal fins and metal pins.

10. The heat sink assembly as claimed in claim 9 wherein said heat-conductive base plate comprise a top surface and a bottom surface, wherein said assembly further comprises at least one heat generating device attached to said bottom surface of said heat-conductive base plate, and wherein said plurality of heat pipes extend from said top surface of said heat-conductive base plate in a location that is substantially perpendicular to a location of said heat generating device attached to said bottom surface.

11. The heat sink assembly as claimed in claim 7 wherein at least one of said plurality of heat pipes of said heat sink comprises a plurality of flat fins that extend from said outer surface of each of said plurality of heat pipes.

12. The heat sink assembly as claimed in claim 7 wherein said means for increasing said contact area between said evaporator portion of at least one of said plurality of heat pipes and said base plate further comprises at least one conductor block attached to, and forming a part of, said base plate; and wherein at least one of said plurality of heat pipes is attached to and extends from said conductor block.

13. The heat sink assembly as claimed in claim 12 wherein said base plate comprises a plurality of grooves in one grooved surface thereof and wherein said conductor block is adapted to attach said grooved surface.

14. The heat sink assembly as claimed in claim 12 wherein said conductor block is a cylindrical in shape in comprises a plurality of threads, and wherein said base plate comprises at least one threaded opening therein dimensioned to mate with said plurality of threads of said conductor block.

* * * * *